(12) United States Patent
Nedelec

(10) Patent No.: US 8,021,739 B2
(45) Date of Patent: Sep. 20, 2011

(54) SINTERED GLASS AND GLASS-CERAMIC STRUCTURES AND METHODS FOR PRODUCING

(75) Inventor: Yann P M Nedelec, Avon (FR)

(73) Assignee: Corning Incorporated, Corning, NY (US)

( * ) Notice: Subject to any disclaimer, the term of this patent is extended or adjusted under 35 U.S.C. 154(b) by 912 days.

(21) Appl. No.: 11/716,333

(22) Filed: Mar. 9, 2007

(65) Prior Publication Data

US 2007/0261750 A1 Nov. 15, 2007

(30) Foreign Application Priority Data

May 15, 2006 (EP) ..................................... 06300471

(51) Int. Cl.
| | |
|---|---|
| B32B 3/00 | (2006.01) |
| B32B 1/00 | (2006.01) |
| B32B 3/12 | (2006.01) |
| B32B 3/20 | (2006.01) |
| B32B 7/14 | (2006.01) |
| B32B 7/00 | (2006.01) |
| B32B 17/00 | (2006.01) |
| B32B 18/00 | (2006.01) |
| B41M 5/00 | (2006.01) |
| B44C 1/17 | (2006.01) |
| G03G 7/00 | (2006.01) |
| C03B 29/00 | (2006.01) |
| C04B 33/34 | (2006.01) |
| C03C 8/00 | (2006.01) |
| B01L 3/00 | (2006.01) |
| B01L 99/00 | (2010.01) |

(52) U.S. Cl. ...... 428/166; 428/178; 428/188; 428/195.1; 428/201; 428/210; 156/89.11; 156/89.22; 501/14; 65/17.3; 65/33.6; 65/42; 65/43; 422/500; 422/501; 422/502; 422/503

(58) Field of Classification Search ........................ None
See application file for complete search history.

(56) References Cited

U.S. PATENT DOCUMENTS

| | | | | |
|---|---|---|---|---|
| 5,518,969 A | * | 5/1996 | Ragan ............................. | 501/32 |
| 5,853,446 A | * | 12/1998 | Carre et al. .................... | 65/17.3 |
| 6,379,785 B1 | * | 4/2002 | Ressler et al. ............. | 428/304.4 |
| 6,769,444 B2 | | 8/2004 | Guzman et al. ............ | 137/15.01 |
| 2003/0192587 A1 | | 10/2003 | Guzman et al. ............ | 137/15.01 |
| 2004/0152580 A1 | * | 8/2004 | Marques ......................... | 501/66 |
| 2005/0241815 A1 | * | 11/2005 | Caze et al. .................... | 165/170 |

FOREIGN PATENT DOCUMENTS

| | | | |
|---|---|---|---|
| EP | 1415707 | | 6/2004 |
| JP | 09165230 A | * | 6/1997 |
| WO | WO2004/050575 | | 6/2004 |

(Continued)

OTHER PUBLICATIONS

Machine translation of JP 09-165230 (1997).*
http://armstrongglass.com/fritsize.html (2010).*

* cited by examiner

Primary Examiner — Alicia Chevalier
Assistant Examiner — Frank D Ducheneaux
(74) Attorney, Agent, or Firm — Gregory V. Bean

(57) ABSTRACT

A unitary structure (10) is comprised of two or more planar substrates (30, 40) fused together by a glass or glass-ceramic sintered frit structure (20) disposed therebetween. The pattern of the sintered patterned frit material defines passages (70) therein, and the sintered frit structure (20) has a characteristic minimum feature size (60) in a direction parallel to the substrates. Particles of the frit material have a poly-dispersed size distribution up to a maximum frit particle size, in a maximum length dimension, and the minimum feature size or dimension (60) of the sintered patterned frit material is greater than 2 times the maximum frit particle size, desirably about 3 times or more, and less than 6.25 times the maximum frit particle size, desirably about 5 times or less, most desirably about 4 times or less. A method for making the structure (10) is also disclosed.

13 Claims, 4 Drawing Sheets

SINTERED GLASS AND GLASS-CERAMIC STRUCTURES AND METHODS FOR PRODUCING

PRIORITY

This application is claiming the priority of: European Patent Application Number 06300471.7 filed May 15, 2006, titled SINTERED GLASS AND GLASS-CERAMIC STRUCTURES AND METHODS FOR PRODUCING.

BACKGROUND OF THE INVENTION

1. Field of the Invention

The present invention relates generally to sintered glass and glass-ceramic structures and methods for their formation, and particularly sintered glass and glass-ceramic structures formed on a solid substrate and methods for formation of such.

2. Technical Background

One useful fabrication method for the formation of glass or glass-ceramic structures, such as glass or glass-ceramic structures for use as fluidic or microfluidic devices, is to form a relatively fine 3-D structure, such as walls defining fluidic passages of a fluidic or microfluidic device, by shaping a glass frit and binder mixture, on or onto a substrate. The substrate and frit together may then be stacked, with one or more other substrates each of which may have its own patterned frit 3-D structure, and sintered together to form a one-piece or unitary device. For a fuller description of one example of manufacturing methods of this type, see U.S. Pat. No. 6,769,444, assigned to the assignee of the present application.

Challenges exist, however, in providing high strength in the final device over a range of feature sizes of the patterned frit material. The physical constraint of the substrate can generate cracks in the 3-D structure during the time when the 3-D structure of the formed frit material is sintered. This results in weak spots, points of potential breakage in the final fully sintered product. Thus devices or methods to prevent such crack formation are desirable.

SUMMARY OF THE INVENTION

The invention includes, according to one embodiment, a unitary structure comprised of two or more planar substrates fused together by a glass or glass-ceramic sintered patterned frit material disposed therebetween. The pattern of the sintered patterned frit material defines passages therein, and the sintered patterned frit material has a characteristic first minimum feature size in a direction parallel to the substrates. Particles of the frit material have a poly-dispersed size distribution up to a maximum frit particle size, in a maximum length dimension, and the first minimum feature size of the sintered patterned frit material is greater than 2 times the maximum frit particle size, desirably about 3 times or more, and less than 6.25 times the maximum frit particle size, desirably about 5 times or less, most desirably about 4 times or less. Setting the minimum feature size sufficiently low relative to the maximum frit particle size makes the structure more robust by preventing crack formation, while keeping it sufficiently high makes the structure more easily manufactured by assuring sufficient resolution in useful forming processes such as molding.

The invention also includes, according to another embodiment, a method for forming, on a substrate, a sintered structure having a desired pattern. The method includes providing a poly-dispersed frit of a material subject to viscous sintering, mixed the frit with a sufficient amount of a binder to allow for forming of the frit-binder mixture. The method further includes forming the frit-binder mixture onto a substrate in a desired pattern, the pattern having a first minimum feature size in a direction parallel to the substrate, then sintering the formed mixture to form a sintered structure. According to this method, the poly-dispersed frit has a maximum particle size greater than 0.16, desirably about 0.2 or more, most desirably about 0.25 or more times the first minimum feature size, and less than and less than 0.5, desirably about 0.3 or less times the minimum feature size. Choosing the particle size sufficiently high makes the resulting structure more robust, while keeping it sufficiently low makes the structure easier to produce. The method may include providing a poly-dispersed frit by ball milling or similar suitable process, then sieving the frit in a sieve sized at one-half the maximum particle size for the frit, retaining all particles that pass for inclusion in the frit. This provides a very simple way to provide a high-performing frit with poly-dispersed particle size distribution according to the methods of the present invention.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

Figure 1:
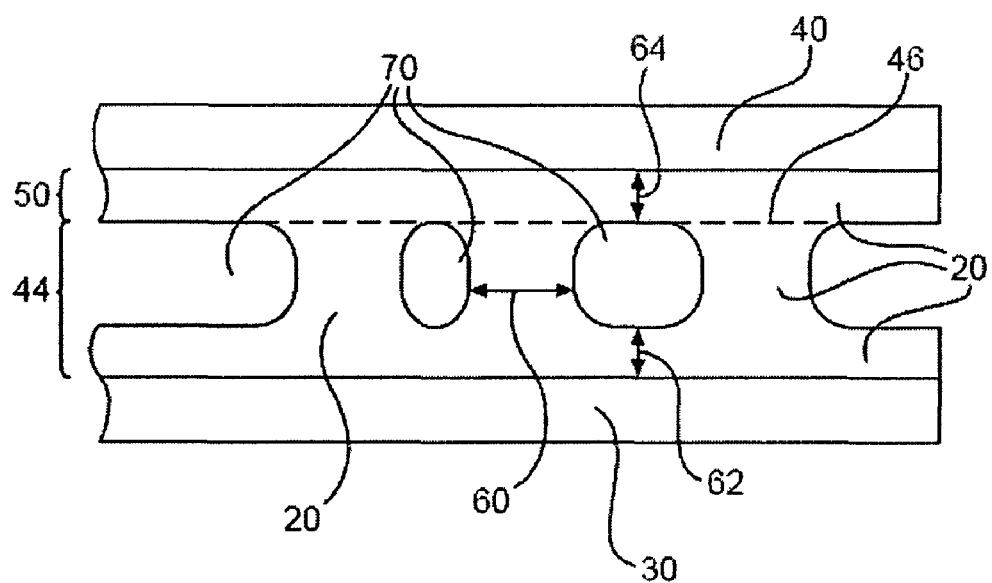
FIG. 1 is a diagrammatic cross-section of one embodiment of a microfluidic device of the present invention.

Microfluidic devices, such as device 10 of FIG. 1, may be comprised of a three-dimensional (3-D) sintered frit structure 20 that is sintered and thereby fused between two substrates 30 and 40 so as to define a monolithic device 10 with fluidic passages 70 therein. In some devices or portions of devices, as in the device 10 represented in FIG. 1, one layer 44 of 3-D frit structure is formed, desirably by molding, on a substrate, then sintered to another substrate having only a thin flat layer of frit 50, resulting in a fused joint within the 3-D frit structure 20, indicated by the dashed line 46. Alternatively, on other devices or portions of devices, two 3-D frit structures first formed on separate substrates may be sintered to each other.

In either case, the resulting patterned sintered frit structure 20 has a characteristic minimum feature size or dimension 60 in the direction parallel to the substrates 30, 40. Dimension 60 corresponds to the characteristic minimum distance between free (unconstrained) surfaces of the frit structure 20, or to the characteristic wall thicknesses of passages 70.

The patterned sintered frit structure 20 also has a characteristic minimum feature size or dimension 62 or 64 in the direction perpendicular to the substrates 30, 40. This dimension 62 or 64 corresponds to the characteristic minimum distance between constrained surfaces of the frit structure 20 (constrained by contract with substrate 30 or 40) and an unconstrained surface of the frit structure 20 (such as an interior surface of a passage 70). Dimension 62 may also be referred to as the thickness of the residual layer, the residual layer being the substrate-covering layer of frit that is produced on the substrate 30 as part of forming the layer 44 of 3-D frit structure. Dimension 64 may also be referred to as the thickness of the flat-layer flat layer of frit 50. Dimensions 62 and 64 may be equal, but may also differ, in which case the smaller of the two dimensions represents the characteristic minimum feature size in the direction perpendicular to the substrates 30, 40.

Break source analysis of microfluidic devices of the type shown in FIG. 1 has revealed that mechanical resistance of the final devices can be altered by cracks, apparently shrinkage cracks, at the bottom of the frit wall structures, i.e., at or near the internal corners of the fluidic passages 70. Further, it was identified that cracks were the most frequent source of breakage when the final fluidic device 10 was put under pressure testing for measuring internal pressure capability, whether failures occurred below or above desired specifications.

Investigation showed that designs with structures like that of FIG. 1, where the dimension 60 was about 500 µM, made using frit having a poly-dispersed particle size distribution (PSD) sieved below 63 µm, did not have any cracks. But when using the same frit with the a formed frit structure 20 having a minimum feature size or dimension 60 parallel to the substrate of about 1000 µM, cracks were observed in the final product, and their formation was detected during presintering (partial sintering), and persisted through a final sintering stage. Thermal treatments were investigated in order to try to solve the cracking problem, but these effects appeared to play at most a second-order role In ceramic powder forming and sintering, smallest particle size and highest particle uniformity is generally preferred. But by testing frit with a smaller maximum particle size and greater size uniformity, a frit sieved at 20 µm with all passing particles retained, the crack defects were seen to be dramatically increased. By testing frits with larger poly-dispersed PSDs, a frit sieved at 125 µm and a frit sieved at 160 µm both with all passing particles retained, it was found that no cracks were formed. Accordingly, poly-dispersed frits having higher maximum particle sizes were found to perform better than smaller-sized poly-dispersed frit. Crack formation is eliminated or sharply reduced, and pressure resistance is improved significantly, on the order of from 8 to 32% for 125 µm sieved compared to 63 µm sieved frit.

Results of these experiments are shown in FIGS. 2A-E, which are cross-sectional photomicrographs of a partially sintered or "presintered" frit structure 20. Such presintering may desirably be used to give physical strength and cohesion to a formed frit structure prior to assembly of the desired multiple substrates for final sintering. From left to right in the FIGS. 2A-E, the respective sieve sizes employed to produce the frit used to form the structure 20 were 20, 63, 80, 125, and 160 µm. Cracks 80 may be seen as white areas in the photomicrographs. As may be seen from the figures, cracks are present for sieve sizes 20, 63, and 80, but absent for sieve sizes 125 and 160. These results are further summarized in FIG. 3, which shows the PSDs by cumulative volume percentage as a function of equivalent diameter of the particles in micrometers, as detected by a laser granulometer. Traces 102, 104, 106, 108, and 110 show the distributions resulting from sieving below 20, 63, 80, 125, and 160 micrometers, respectively.

With the increased particle size of the frit sieved at 125 µm, the quantity of binder used can also be reduced (from 20% wt binder to 17.6% wt with identical mixing, and all the way down to 15.3% wt with more thorough mixing), while maintaining the same viscosity of the frit and binder mixture.

By the methods of the present invention, the complete desired PSD can be very simply obtained, by dry grinding then sieving, compared to what is typically done in ceramics industry, where several mono-dispersed PSDs, prepared independently, must be mixed together in order to improve the initial compactness of the particles mixed with binder. Here, in contrast, the global poly-dispersed PSD below one size value is kept after sieving, resulting in a continuous PSD with good resulting compactness, very small particles being generated intrinsically by the dry grinding itself.

While not wishing to be limited by a single theoretical explanation, the inventor understands the effects of the invention in this manner.

When a 3-D shaped frit structure such as layer 44 is sintered on a substrate, this results in sintering under constraint, namely the constraint of the fixed substrate geometry. In the present method, the 3-D structures are preferably formed with a residual flat layer of frit having a thickness 62, such that the interface between the residual layer and substrate 30 is under constraint while top of the layer 44 is much freer during pre-sintering or early final sintering. In case of high shrinkage, the stress generated is high, resulting in cracks.

Effectively adding bigger particles to the PSD by sieving at a larger size, while keeping the very small particles and continuous distribution provided by dry grinding, results in less binder required, because the voids between fine particles that are replaced by a bigger particle are intrinsically replaced by the material of the bigger particle. Less binder and the associated less total void volume gives less shrinkage on sintering.

Although glass has been used in the experiments, any materials that can undergo a viscous sintering process, such as glass-ceramics and potentially some other ceramic materials can be used similarly.

The frit mixture may be prepared as follows. The desired glass or glass ceramic may be ball milled, then sieved below the desired size (in the presently preferred case, a sieve of 125 µm is used), and all the fraction below the desired size is used for paste (frit and binder mixture) preparation. In order to protect the sieve from the biggest particles, a bigger sieve is added. For example, a 1 mm sieve may be used on top of the 125 µm sieve in order to protect it. There is no limitation for the size of ball mill, the initial quantity of glass, the ball loading, or the grinding duration or speed, the goal being to obtain the particle size distribution wanted.

The grains typically obtained after grinding have an aspect ratio around 1:2, meaning that during sieving, the biggest particles able to go through the sieve have a length equal to about 2 times the size of the opening in the sieve. As consequence, the biggest dimension of biggest particles in a PSD sieved below 63 μm is around 126 μm, while it is around 250 μm for a PSD sieved below 125 μm. These values also correspond to the highest values measured on PSD curves obtained by a laser granulometer where particles are characterized in all their dimensions. The lowest value on the PSD curve corresponds to the finest particle dimension detected, which is around 1.3 μm in all cases described here. If PSD is instead characterized by using equipment employing particle sedimentation in a solvent, only lengths of particles will be characterized because particles sediment in the direction of the lowest resistance to flowing, and the PSD curve will be different than the one obtained on a laser granulometer. Care must thus be taken in PSD curve interpretation, depending on the equipment used for PSD characterization, and particularly when particles are not very spherical.

Figure 3:
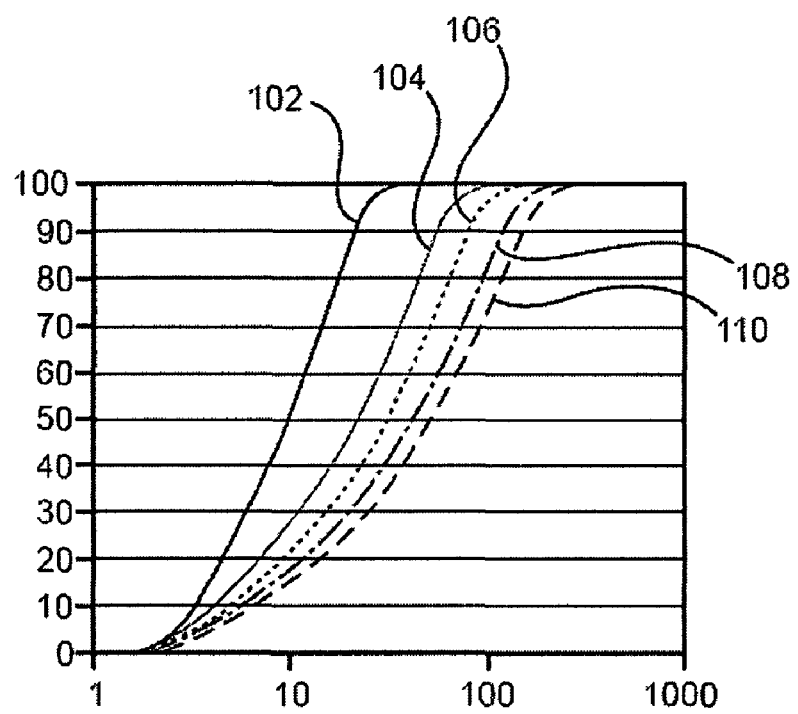
FIG. 3 is a graph showing the particle size distributions and the results of the frits used to make the structures of FIGS. 2A-E.
Figure 2:
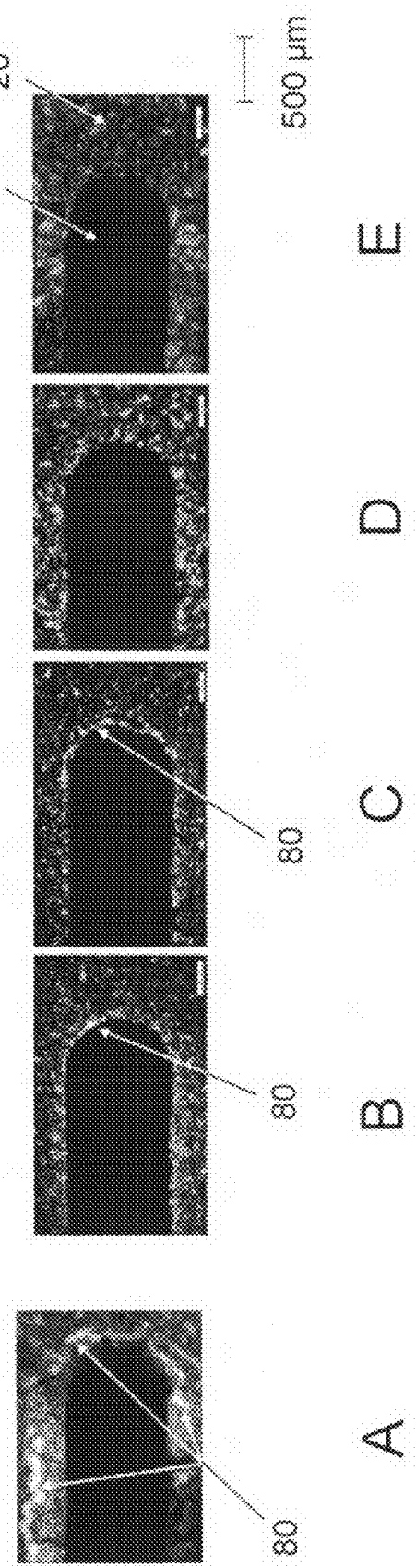
FIGS. 2A-E are photomicrographs of portions of a frit structure 20.

FIGS. 2 and 3 show that the cracking problem is almost but not quite absent in the 80 μm sieved frit, where the minimum parallel feature size or dimension 60 of FIG. 1 is 1000 μm. Given the 1:2 aspect ratio of the particles, the 80 μm sieved frit has a maximum particle size, in the maximum size direction, of 160 μm. Thus, it is desirable that the minimum parallel feature size or dimension be less than about 6.25 times the maximum particle size, desirably about 5 times the maximum particle size or less. As shown in FIGS. 2 and 3 and as discussed above, 125 μm sieved frit showed no cracks for a minimum parallel feature size of 1000 μm, while 63 μm sieved frit showed no cracks for a minimum parallel feature size of 500 μm. Thus it is most desirable that the minimum parallel feature size or dimension be about 4 times the maximum particle size or less.

It has also been found that cracking will arise when the minimum feature size in the perpendicular direction, dimension 62 or 64, is too large. In particular, it is desirable that the minimum feature size in the perpendicular direction should be about 2.5 or less times the maximum particle size, desirably about 1.5 times or less, where possible.

As noted above, going from a PSD sieved below 63 μm to a PSD sieved below 125 μm, it has been observed that for the same mixing procedure, the proportion of binder in the paste may be decreased from 20% wt to 17.6% wt while keeping a similar paste viscosity. By improving mixing by increasing the mixing time, the quantity of binder may be decreased to only 15.3% wt to keep a similar paste viscosity. The decreasing of binder quantity is going in the right direction to limit the global shrinkage from a molded or formed part to a sintered part, and can be explained by the fact that in switching to PSD sieved below 125 μm, there are fewer voids, due to the presence of additional bigger particles.

Because the frit materials used in this process, and hence in the resulting device, are subject to viscous sintering, sintering of big particles into the structures is not a problem, as it could be with a typical ceramic powder. Sintering schedules may need to be adjusted by increasing time or temperature so as to provide sufficiently complete sintering.

While the maximum sized particles of the frits used are desirably large particles, as explained above, and while sintering large particles is feasible with viscous-sintering materials as shown above, still, if the biggest particles in the PSD are too big relative to the minimum feature size of the 3-D structure being formed, there is a risk of losing resolution, i.e., losing small or detailed features, in the course of the molding process desirably used to form the patterned structures. Empirically it has been found desirable that the minimum parallel feature size be greater than 2 times the maximum frit particle size, more desirably at least about 3 times the maximum frit particle size or more, so that resolution issues do not arise.

Figure 4:
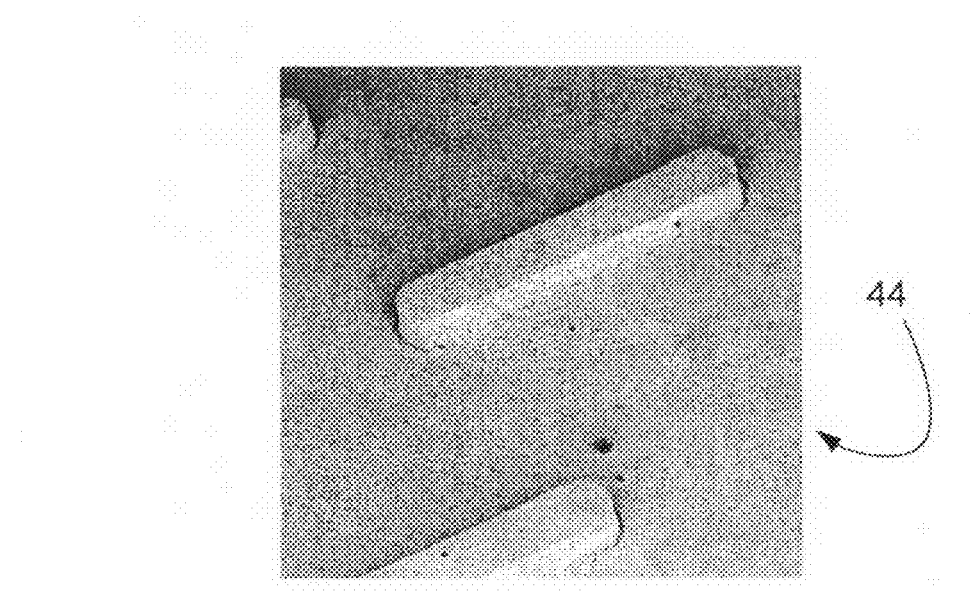
FIG. 4 is a perspective photomicrograph of a layer 44 of 3-D frit structure after sintering, showing cracks at the base of a raised oval structure when 63 μm sieved frit is used for structures of minimum width on the order of 1000 μm.

FIG. 4 is a perspective photomicrograph of a layer 44 of 3-D frit structure after sintering, showing cracks at the base of a raised oval structure when 63 μm sieved frit is used for structures of minimum width on the order of 1000 μm.

Figure 5:
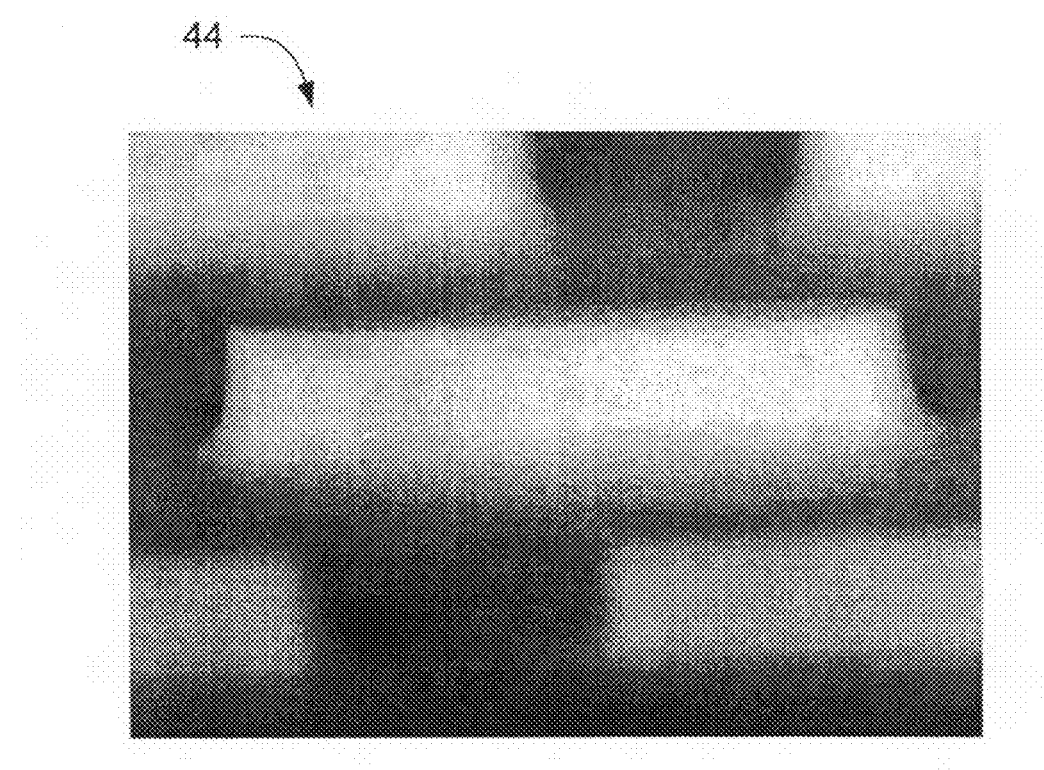
FIG. 5 is a perspective photomicrograph of a layer 44 of 3-D frit structure after sintering, showing the absence of cracks at the base of a raised oval structure similar to that of FIG. 4, but with 125 μm sieved frit used.

FIG. 5 is a perspective photomicrograph of a layer 44 of 3-D frit structure after sintering, showing the absence of cracks at the base of a raised oval structure similar to that of FIG. 4, but with 125 μm sieved frit used. No cracks are formed during pre-sintering.

Figure 6:
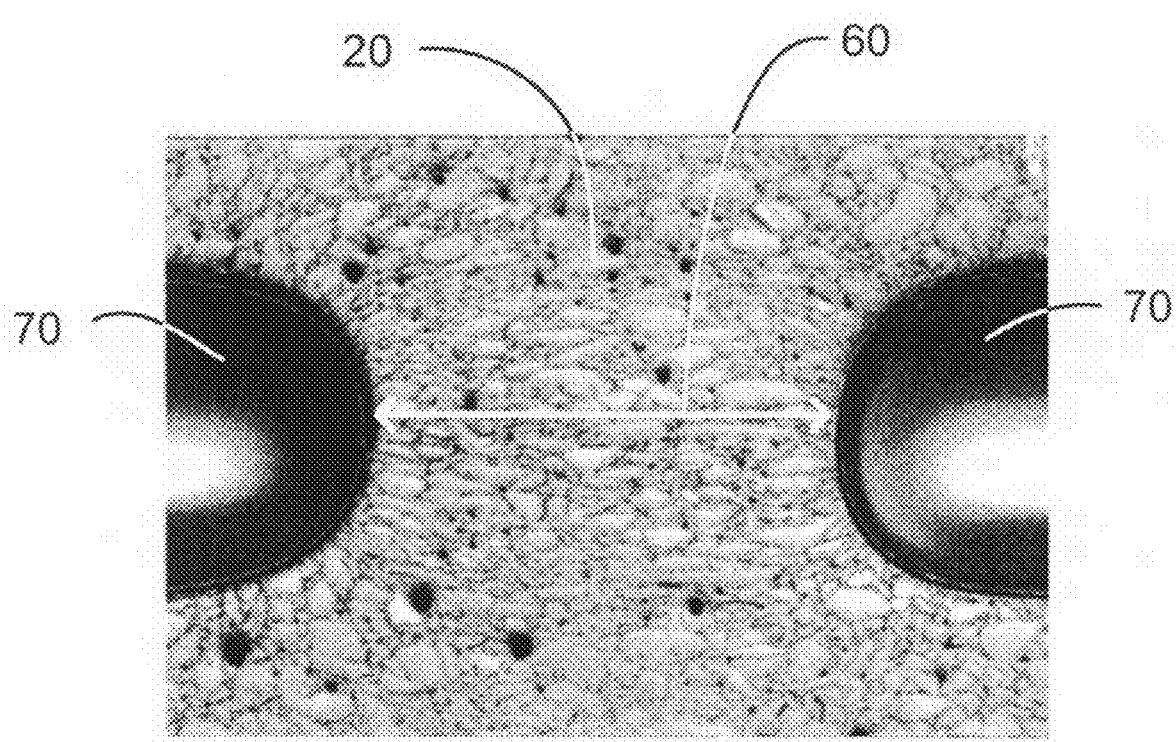
FIG. 6 is a cross-sectional photomicrograph of portion of a device 10 like that of FIG. 1, which has first been sectioned then etched to reveal the grain boundaries in the sintered frit structure 20.

FIG. 6 is a cross-sectional photomicrograph of portion of a device 10 like that of FIG. 1, which has first been sectioned then etched to reveal the grain boundaries in the sintered patterned frit material 20. Without etching, grain boundaries cannot be seen and the sectioned structure appears uniform and smooth. Passages 70 are defined within the 3-D sintered frit structure 20, and are separated by a characteristic minimum feature size or dimension 60 of about 1000 μm. As may be seen from the figure, after final sintering of the structure 20, no cracks are found anywhere in the corners of the passages 70. As may also be noted from the sizes of the grains revealed by etching, the largest particles, on the order of 125 μm, are sufficiently rare and their orientation is sufficiently random that no 125 μm particle is oriented along its long dimension in the cross section shown. Observing the largest particles along their largest dimension typically requires review of multiple sections.

The invention claimed is:

1. A unitary structure comprised of two or more planar substrates fused together by a glass or glass-ceramic sintered patterned frit material having a pattern disposed therebetween, the pattern of said sintered patterned fit material defining passages therein, said sintered patterned frit material having a characteristic first minimum feature size in a direction parallel to said substrates, wherein particles of said frit material have a poly-dispersed size distribution up to a maximum fit particle size, in a maximum length dimension, wherein the first minimum feature size of the sintered patterned frit material is greater than 2 times the maximum frit particle size and less than 6.25 times the maximum frit particle size, and wherein said first minimum feature size is in a range of about 500 to about 1500 μm.

2. The structure as recited in claim 1, wherein the first minimum feature size of the sintered patterned frit material is a range of about 3 to about 5 times the maximum frit particle size.

3. The structure as recited in claim 1, wherein the first minimum feature size of the sintered patterned frit material is a range of about 3 to about 4 times the maximum frit particle size.

4. The structure as recited in claim 2 wherein said sintered patterned frit material has a characteristic second minimum feature size in a direction perpendicular to said substrates, and wherein the second minimum feature size of the sintered patterned frit material is less than or equal to about 2.5 times the maximum frit particle size.

5. The structure as recited in claim 1 wherein said sintered patterned frit material has a characteristic second minimum feature size in a direction perpendicular to said substrates, and wherein the second minimum feature size of the sintered patterned frit material is less than or equal to about 2.5 times the maximum frit particle size.

6. The structure as recited in claim 2 wherein said sintered patterned frit material has a characteristic second minimum feature size in a direction perpendicular to said substrates, and wherein the second minimum feature size of the sintered patterned frit material is less than or equal to about 1.5 times the maximum frit particle size.

7. The structure as recited in claim 1 wherein said sintered patterned frit material has a characteristic second minimum feature size in a direction perpendicular to said substrates, and wherein the second minimum feature size of the sintered patterned frit material is less than or equal to about 1.5 times the maximum frit particle size.

8. The structure as recited in claim 5 wherein said particles have an average aspect ratio in a range of about 2:3 to about 2:6.

9. The structure as recited in claim 4 wherein said particles have an average aspect ratio in a range of about 2:3 to about 2:6.

10. The structure as recited in claim 2 wherein said particles have an average aspect ratio in a range of about 2:3 to about 2:6.

11. The structure as recited in claim 1 wherein said particles have an average aspect ratio in a range of about 2:3 to about 2:6.

12. The structure as recited in claim 1 wherein said particles have an average aspect ratio of about 1:2.

13. The structure as recited in claim 1 wherein the size distribution is continuous.

* * * * *